US007656331B2

(12) United States Patent
Felder et al.

(10) Patent No.: US 7,656,331 B2
(45) Date of Patent: Feb. 2, 2010

(54) SYSTEM ON A CHIP WITH MULTIPLE INDEPENDENT OUTPUTS

(75) Inventors: Matthew D. Felder, Austin, TX (US); Charles Eric Seaberg, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/796,968

(22) Filed: Apr. 30, 2007

(65) Prior Publication Data

US 2008/0100488 A1 May 1, 2008

(51) Int. Cl.
*H03M 3/00* (2006.01)

(52) U.S. Cl. ........................ 341/144; 713/322; 348/105; 386/98

(58) Field of Classification Search ......... 341/144–160; 713/322, 500, 503; 700/94; 386/68–69, 386/46, 52, 95, 98; 348/105, 108
See application file for complete search history.

(56) References Cited

U.S. PATENT DOCUMENTS 6,272,465 B1 * 8/2001 Hewitt et al. ................ 704/258
6,717,533 B2 * 4/2004 Seaberg et al. ................ 341/61
6,778,034 B2 * 8/2004 Nir et al. ...................... 333/12
7,065,287 B1 * 6/2006 Heredia et al. ................ 386/52
7,121,639 B2 * 10/2006 Plunkett ...................... 347/13
7,280,880 B2 * 10/2007 Schmale ...................... 700/97
2008/0104433 A1 * 5/2008 May et al. ................... 713/300
2008/0104434 A1 * 5/2008 May ........................... 713/322

OTHER PUBLICATIONS

Sigmatel STMP3600 Product Brief, SIGMATEL Mixed-Signal Multimedia Semiconductors, 2 pages, 2006.
IDT Product Brief, Value-Line Two-Channel AC'97 CODECS With Headphone Drive and SPDIF Output, pp. 1-6, 2006.

* cited by examiner

*Primary Examiner*—Lam T Mai
(74) *Attorney, Agent, or Firm*—Gary R. Stanford

(57) ABSTRACT

An audio output circuit includes a DAC module, a line out circuit, and a headphone amplifier circuit. The digital to analog conversion (DAC) module is coupled to convert an audio component of digitized multimedia data into an analog audio signal. The line out circuit is coupled to amplify the analog audio signal based on a line out volume setting. The headphone amplifier is coupled to amplify the analog audio signal based on a volume setting to produce an amplified analog audio signal.

17 Claims, 5 Drawing Sheets

SYSTEM ON A CHIP WITH MULTIPLE INDEPENDENT OUTPUTS

CROSS REFERENCE TO RELATED PATENTS

Not Applicable

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to mixed signal integrated circuits and more particularly to multiple independent outputs of a system on a chip.

2. Description of Related Art

In general, a system on a chip (SOC) integrates multiple independent circuits, which are typically available as individual integrated circuits, onto a single integrated circuit. For example, an audio processing SOC combines a processing core (e.g., microprocessor and/or digital signal processor, instruction cache, and data cache), an audio codec (e.g., digitization of analog audio input signals and converting digitized audio signals into analog output signals), a high speed serial interface (e.g., universal serial bus (USB) interface), and an external memory interface.

To facilitate the conversion of digitized audio signals into analog output signals, the audio codec of an audio processing SOC includes a digital to analog converter (DAC) that provides its output to a headphone amplifier and/or to a line out driver, but with limitations. For example, in one known embodiment, the line out driver and the headphone amplifier are serially coupled to output of the DAC. In this embodiment, the headphone amplifier is dependent on line out driver such that the line out driver cannot be muted and/or powered down without affecting the headphone amplifier.

In another known embodiment, the headphone amplifier and line out driver are separately coupled to the output of the DAC. In this embodiment, the DAC provides volume control for the headphone amplifier, which also affects the signal level to the line out driver. To provide a relatively constant signal level output, the line out driver includes an inverse volume control function to counteract the volume adjustments by the DAC, which has limited accuracy. While this embodiment provides digital volume control and a wider volume range via the DAC, it adversely affects the line out driver.

In either of the above embodiments, the DAC, the headphone amplifier, and the line out driver are supplied with the same voltage. The typical output levels of the line out driver mandate the use of a higher supply voltage than what is necessary for the headphone amplifier and the DAC. Using a common voltage supply can save pins by sourcing the three circuits through a single pin. This comes with the cost of the extra power consumed by running the DAC and the headphone amplifier at higher than needed supply voltages.

In addition, the DAC, the headphone amplifier, and the line out driver have separate ground pin connections to provide isolation between the circuits. While this provides a desired level of isolation, it requires extra pins to implement.

Therefore, a need exists for a SOC that includes multiple independent outputs that overcomes one or more of the above mentioned limitations.

BRIEF DESCRIPTION OF THE SEVERAL VIEWS OF THE DRAWING(S)

DETAILED DESCRIPTION OF THE INVENTION

Figure 1:
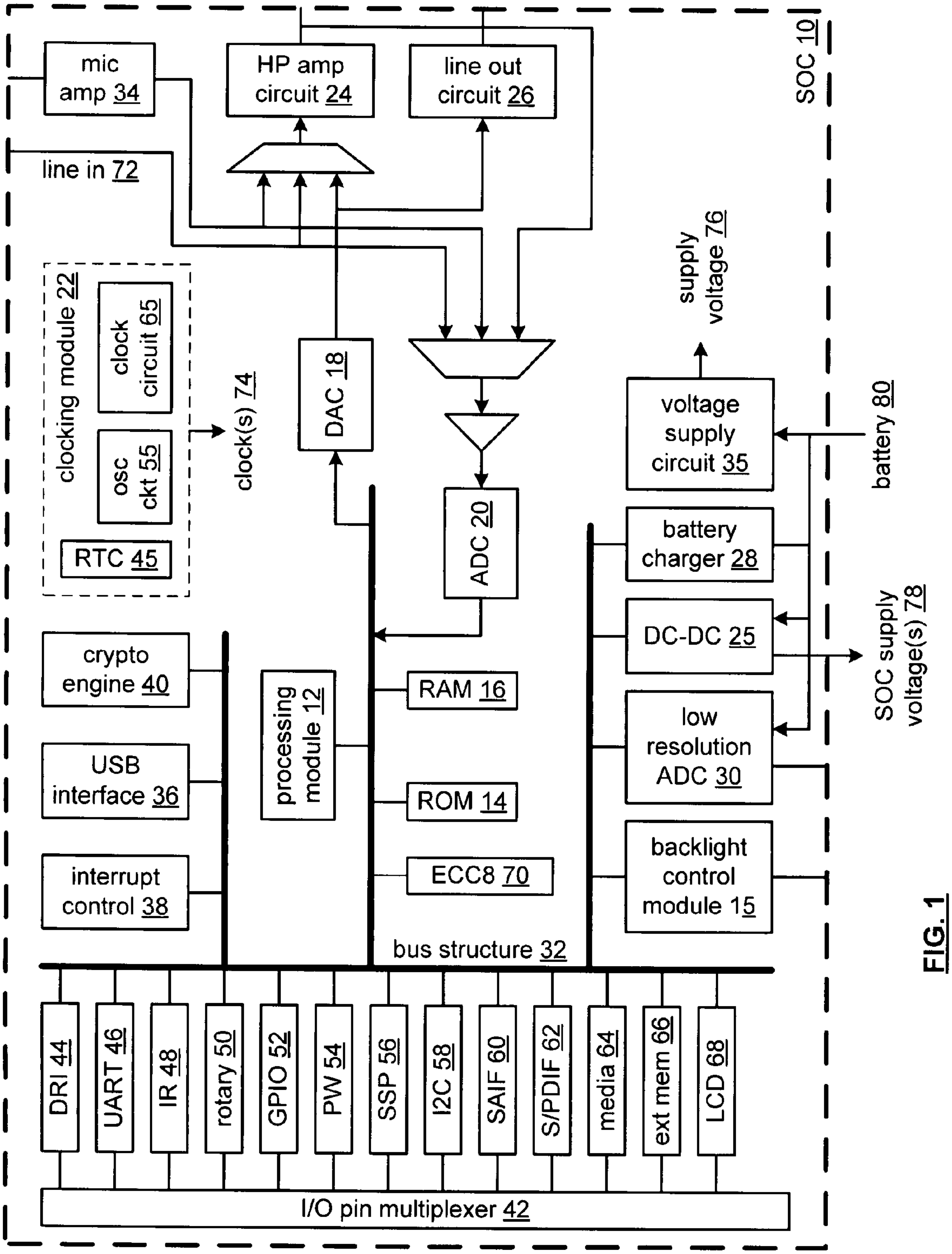
FIG. 1 is a schematic block diagram of a system on a chip (SOC) in accordance with the present invention.

FIG. 1 is a schematic block diagram of a system on a chip (SOC) 10 that may be used in a portable entertainment device (e.g., an MP3 player, an advanced MP3 player (i.e., music, photos, and video playback), cellular telephones, personal computers, laptop computers, and/or personal digital assistants. The SOC 10 includes at least some of a processing module 12, read only memory (ROM) 14, a backlight control module 15, random access memory (RAM) 16, a digital to analog conversion (DAC) module 18, an analog to digital conversion (ADC) module 20, a clocking module 22, a headphone (HP) amplifier circuit 24, a DC-DC converter 25, a line out circuit 26, a battery charger 28, a low resolution ADC 30, a bus structure 32, a microphone amplifier 34, a voltage supply circuit 35 that produces a supply voltage 76, a universal serial bus (USB) interface 36, an interrupt controller 38, a crypto engine 40, an input/output pin multiplexer 42, a plurality of interface modules 44-68, an ECC8 module 70, and a line in pin 72.

The clocking module 22 includes one or more of a real time clock (RTC) module 45, an oscillation circuit 55, and a clock circuit 65. In one embodiment, the oscillation circuit 55 is coupled to an off-chip crystal and produces therefrom an oscillation which has a frequency primarily determined by the physical properties of the crystal. The clock circuit 65 may use the oscillation as a reference oscillation to produce one or more clock signals 74 that are used by at least some of the other blocks of the SOC. The RTC module 45 provides timing functions such as a second counter, a programmable millisecond interrupt, an alarm interrupt and power-up facility, a watchdog reset, and storage and access to persistent registers.

The plurality of interface modules 44-68 includes at least some of a digital recording interface (DRI) interface 44, a universal asynchronous receiver-transmitter (UART) interface 46, an infrared (IR) interface 48 (e.g., IrDA), a rotary controller 50, a general purpose input/output (GPIO) interface 52, a pulse width (PW) interface 54, a security software provider (SSP) interface 56, an 12C interface 58, a serial audio input (SAIF) transmit and/or receive interface 60, a Sony Philips Digital Interface (SPDIF) 62, a media interface 64, an external memory interface 66, and a liquid crystal display (LCD) interface 68. In an application, the DRI interface 44 may be used to interface with a stereo FM (frequency modulated) receiver; the UART interface 46 may be used to interface with a host device and/or be used to debug the SOC; the IR interface 48 may be used to provide peer-to-peer IR communication; the pulse width interface 54 may be used in connection with the backlight control module 15 to control backlighting of a display and/or to provide an output beep; the SSP interface 56 may be used to interface with off-chip devices having one or more of an multimedia card (MMC) interface, a scientific data (SD) interface, a secure digital input/output (SDIO) interface, a consumer electronics-AT attachments (CE-ATA) interface, a Triflash interface, a serial peripheral interface (SPI), and a master software (MS) interface; the S/PDIF interface 62 may be used to interface with off-chip devices having an S/PDIF transmit and/or receive interface; the media interface 64 may be used to interface with a hard drive, NAND flash or compact flash to transceiver digitized audio, video, image, text, and/or graphics data; the external memory interface 66 may be used to interface with an SDRAM, a NOR memory, and/or a dual data rate (DDR) memory device; and the LCD interface 68 may be used to interface with a display.

The DC-DC converter 25, which may be a buck and/or boost converter, generates one or more SOC supply voltages 78 from a battery 80. For example, the DC-DC converter 25 may produce a 1.2 V supply voltage, a 1.8 V supply voltage, and a 3.3 V supply voltage. Note that the DC-DC converter 25 may use a single off-chip inductor to produce the SOC supply voltages 78. Further note that when the SOC 10 is receiving power from a source other than the battery 80 (e.g., 5 V from a USB connection 36), the DC-DC converter 25 may generate one or more the SOC voltages from the alternative power source. When the alternate power source is available, the battery charger 28 may be enabled to charge the battery 80.

In operation, the processing module 12 coordinates the recording, playback, and/or file management of multimedia data (e.g., voice, audio, text, data, graphics, images, and/or video). The processing module 12 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 12 may have an associated memory and/or memory element, which may be a single memory device, a plurality of memory devices, and/or embedded circuitry of the processing module. Such a memory device may be a read-only memory 14, random access memory 16, volatile memory, non-volatile memory, static memory, dynamic memory, flash memory, cache memory, and/or any device that stores digital information. Note that when the processing module 12 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module executes, hard coded and/or operational instructions corresponding to at least some of the steps and/or functions illustrated in FIGS. 1-5.

In a playback mode of operation, the processing module 12 coordinates the retrieval of multimedia data from off-chip memory via one of the interfaces 44, 48, 52, 56, 60, 62, 64, and/or 66. The retrieved data is routed within the SOC via the bus structure 32, which may include a peripheral bus and an advanced high-performance bus (AHB). If the retrieved data is encrypted, the crypto engine 40 decrypts the retrieved data to produce decrypted retrieved data. If the decrypted retrieved data is encoded (e.g., is an MP3 file, WMA file, MPEG file, JPEG file, etc.), the processing module 12 coordinates and/or performs the decoding of the retrieved data to produce digitized data. An audio component of the digitized data is provided to the DAC module 18, which may include one or more digital to analog converters. The DAC 18 converts the digitized audio component into analog audio signals. The headphone amplifier circuit 24 and the line out circuit 26 provide the analog audio signals off-chip. A video or image component of the digitized data is provided to the LCD interface for display.

In an audio record mode, the processing module 12 coordinates the storage of analog audio input signals received via the microphone amplifier 34 or the line input 72. In this mode, the ADC module 20 converts the analog audio input signals into digitized audio signals which are then placed on the bus structure. In one embodiment, the processing module 12 may coordinate the storage of the digitized audio signals in an off-chip memory device. In another embodiment, the processing module 12 coordinates and/or performs encoding (e.g., MP3, WMA, etc.) of the digitized audio signals to produce encoded audio signals, which are subsequently stored in off-chip memory.

In a file management mode, the processing module 12 coordinates the transferring, editing, and/or deleting of files (e.g., MP3 files, WMA files, MPEG files, JPEG files, and/or any other type of music, video and/or still image files) with a host device via the USB interface 36. For example, the host device (e.g., a laptop or PC) may download a music file to the portable entertainment device that includes the SOC 10 via the USB interface 36. The USB interface 36 places the music file on the bus structure 32 and it is routed to the desired destination under the control of the processing module 12. Note that the interrupt control module 38 facilitates the various modes of operation by processing interrupts, providing timers, and direct memory access.

Figure 2:
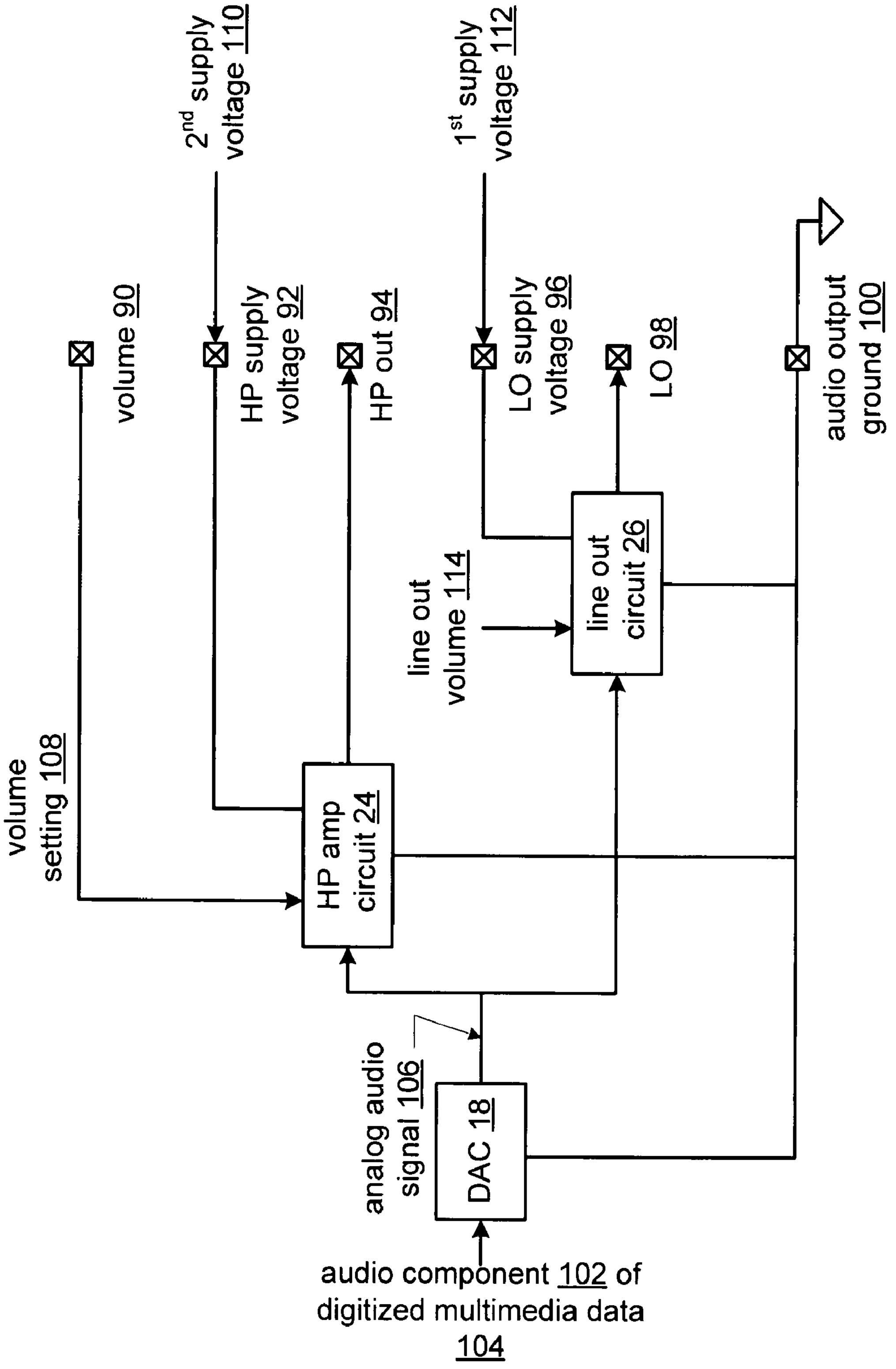
FIG. 2 is a schematic block diagram of an embodiment of a digital to analog converter module, headphone amplifier circuit, and line out circuit in accordance with the present invention.

FIG. 2 is a schematic block diagram of an embodiment of an audio output circuit that includes a digital to analog converter (DAC) module 18, the headphone amplifier circuit 24, and the line out circuit 26. In this embodiment, the DAC module 18 converts an audio component 102 of digitized multimedia data 104 (e.g., voice data, audio data, text data, graphics data, image data, and/or video data) into an analog audio signal 106.

The headphone amplifier circuit 24 amplifies the analog audio signal 106 in accordance with a volume setting 108 to produce a headphone output signal, which is outputted via an HP output pin 94. In an embodiment, the volume setting 108 may be received via a volume setting pin 90 of the SOC 10 or it may be set via on-chip resistors. For example, the portable entertainment device incorporating the SOC 10 may include a volume switch that establishes a desired volume level. In an embodiment, a digital representation of desired volume setting 108 is stored in a register associated with the headphone amplifier circuit 24. In another embodiment, the digital signal representing the desired volume setting 108 is an input to the headphone amplifier circuit 24. Alternatively, the processing module 12 may receive the analog or digital signal representing the desired volume level and convert it into the volume setting 108 that is provided to the headphone amplifier circuit 24.

The line out circuit 26 amplifies the analog audio signal 106 to produce a line out signal. As a driver, the line out circuit 26 provides a desired output impedance to drive a load coupled to the LO output pin 98 with the analog audio signal 106, or a scaled version thereof in accordance with the line out volume 114. Note that the line out volume 114 is independent of the volume setting 108 and does not change with the volume setting 108.

As shown, the headphone amplifier circuit 24 is powered via a $2^{nd}$ supply voltage 110 that is received via an HP supply voltage pin 92 and the line out circuit 26 is powered via a $1^{st}$ supply voltage 112 that is received via an LO supply voltage pin 96. In this embodiment, the first supply voltage 112 (e.g., 3.3 volts) is greater than the second supply voltage 110 (e.g., 1.2 volts or 1.8 volts). As is also shown, the DAC 18, the headphone amplifier circuit 24, and the line out circuit 26 are coupled to a common audio output ground pin 100. As configured, the DAC 18 does not perform volume adjustment such that its output is based on the range of the DAC and not on the desired volume setting. Thus, the line out circuit 26 does not need an inverse volume function and can be individually muted or adjusted from adjustments of the headphone amplifier circuit 24, which has an independent volume control 108. Further, by powering the headphone amplifier circuit 24 and the line out circuit 26 by different power supply voltages, power consumption is reduced as well as providing individual power up/down of the headphone amplifier circuit 24 and the line out circuit 26. Accordingly, the embodiment of FIG. 2 provides a truly independent headphone amplifier circuit 24 and line out circuit 26.

Figure 3:
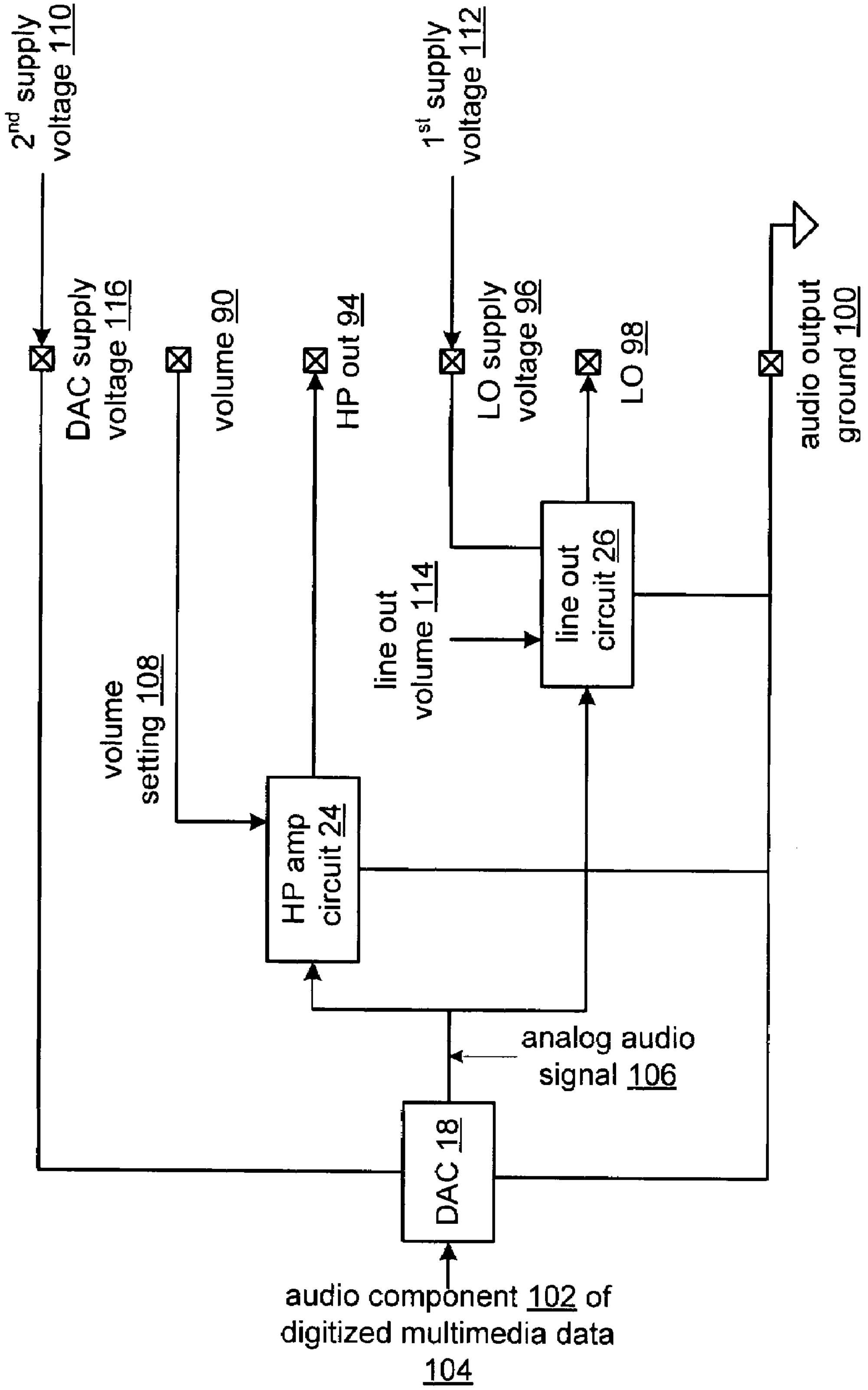
FIG. 3 is a schematic block diagram of another embodiment of a digital to analog converter module, headphone amplifier circuit, and line out circuit in accordance with the present invention.

FIG. 3 is a schematic block diagram of another an embodiment of an audio output circuit that includes a digital to analog converter (DAC) module 18, the headphone amplifier circuit 24, and the line out circuit 26. In this embodiment, the DAC module 18 converts an audio component 102 of digitized multimedia data 104 (e.g., voice data, audio data, text data, graphics data, image data, and/or video data) into an analog audio signal 106.

The headphone amplifier circuit 24 amplifies the analog audio signal 106 in accordance with a volume setting 108 to produce a headphone output signal. In this embodiment, the volume setting 108 may be received via a volume setting pin 90 of the SOC 10, from the processing module 12, and/or as previously discussed. The headphone output signal is outputted via an HP output pin 94.

The line out circuit 26 amplifies the analog audio signal 106 to produce a line out signal. As a driver, the line out circuit 26 provides a desired output impedance to drive a load coupled to the LO output pin 98 with the analog audio signal 106, or a scaled version thereof in accordance with the line out volume 114. Note that the line out volume 114 is independent of the volume setting 108 and does not change with the volume setting 108.

As shown, the DAC 18 is powered via a $2^{nd}$ supply voltage 110 that is received via a DAC supply voltage pin 116 and the line out circuit 26 is powered via a $1^{st}$ supply voltage 112 that is received via an LO supply voltage pin 96. In this embodiment, the first supply voltage 112 (e.g., 3.3 volts) is greater than the second supply voltage 110 (e.g., 1.2 volts or 1.8 volts). As is also shown, the DAC 18, the headphone amplifier circuit 24, and the line out circuit 26 are coupled to a common audio output ground pin 100. As configured, the DAC 18 does not perform volume adjustment such that its output is based on the range of the DAC and not on the desired volume setting. Thus, the line out circuit 26 does not need an inverse volume function and can be individually muted or adjusted from adjustments of the headphone amplifier circuit 24, which has an independent volume control 108. Further, by powering the DAC 18 and the line out circuit 26 by different power supply voltages, power consumption is reduced. Accordingly, the embodiment of FIG. 3 provides a truly independent headphone amplifier circuit 24 and line out circuit 26. In another embodiment, the DAC 18 may be powered by a combination of the first and second power supply voltages 110 and 112 to maximize power efficiency and performance.

Figure 4:
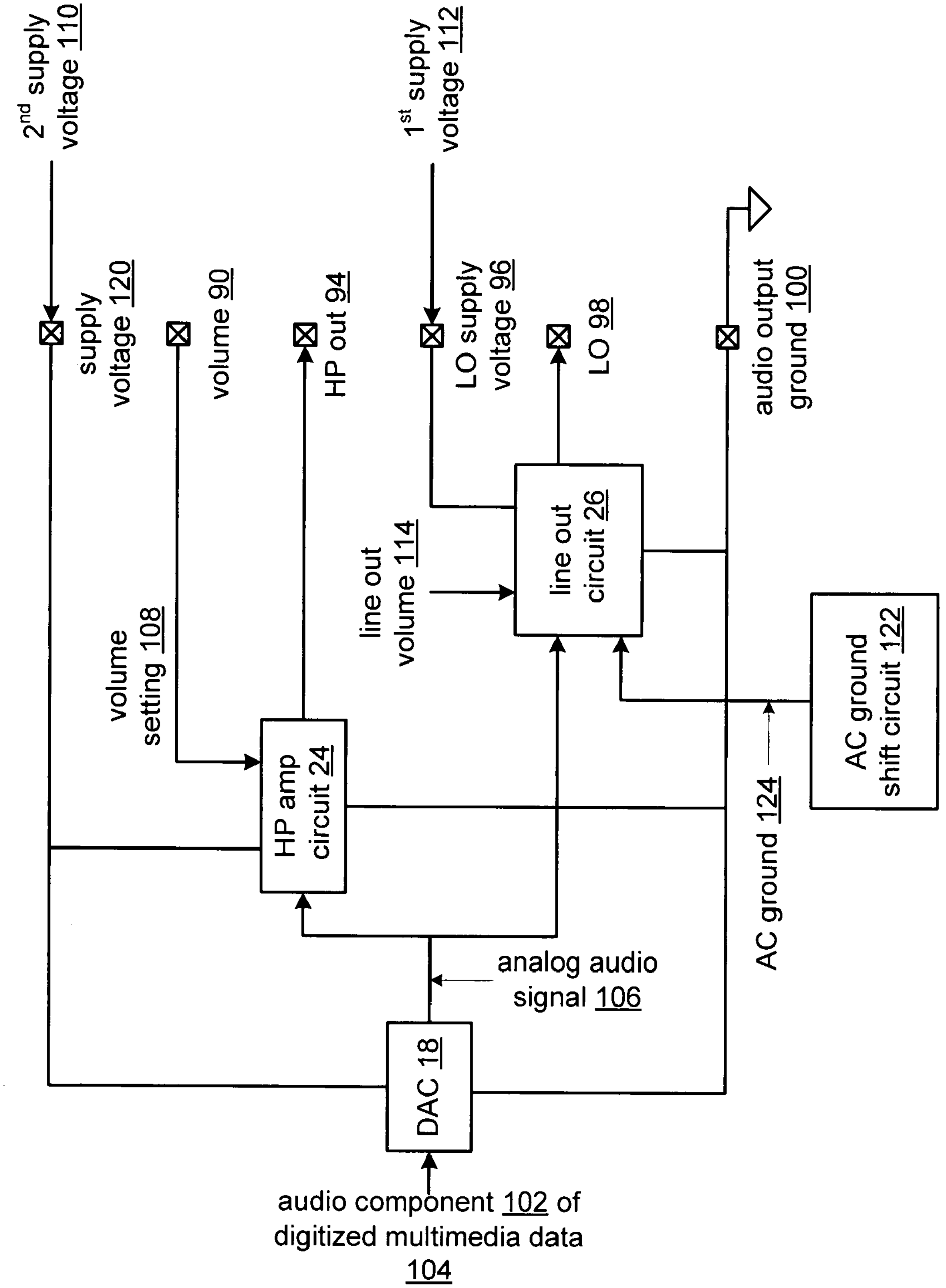
FIG. 4 is a schematic block diagram of another embodiment of a digital to analog converter module, headphone amplifier circuit, and line out circuit in accordance with the present invention.

FIG. 4 is a schematic block diagram of another embodiment of an audio output circuit that includes a digital to analog converter (DAC) module 18, the headphone amplifier circuit 24, the line out circuit 26, and an AC ground shift circuit 122. In this embodiment, the DAC module 18 converts an audio component 102 of digitized multimedia data 104 (e.g., voice data, audio data, text data, graphics data, image data, and/or video data) into an analog audio signal 106.

The headphone amplifier circuit 24 amplifies the analog audio signal 106 in accordance with a volume setting 108 to produce a headphone output signal. In this embodiment, the volume setting 108 may be received via a volume setting pin 90 of the SOC 10, from the processing module 12, and/or as previously discussed. The headphone output signal is outputted via an HP output pin 94.

The line out circuit 26 amplifies the analog audio signal 106 based on a shifted AC ground 124 to produce a line out signal. As a driver, the line out circuit 26 provides a desired output impedance to drive a load coupled to the LO output pin 98 with the analog audio signal 106, or a scaled version thereof in accordance with the line out volume 114. Note that the line out volume 114 is independent of the volume setting 108 and does not change with the volume setting 108.

The AC ground shift circuit 122 adjusts the AC ground 124 for the line out circuit based on the first power supply voltage 112 and at least one output parameter of the DAC module 18. Note that the output parameter of the DAC module 18 includes one or more of a common mode voltage, the DAC's AC ground, DAC output range and/or swing, the second supply voltage 110, etc. For example, if the DAC 18 is powered via a 1.8 V supply voltage and the line out circuit 26 is powered via a 3.3 V supply voltage, the AC ground for the DAC output may be 0.9 volts and the AC ground for the line out circuit 26 may be 1.65 volts. In this example, the AC ground shift circuit 122 shifts AC ground from 0.9 volts to 1.65 volts.

As shown, the DAC 18 and the headphone amplifier circuit 24 are powered via a $2^{nd}$ supply voltage 110 that is received via a supply voltage pin 120 and the line out circuit 26 is powered via a $1^{st}$ supply voltage 112 that is received via an LO supply voltage pin 96. In this embodiment, the first supply voltage 112 (e.g., 3.3 volts) is greater than the second supply voltage 110 (e.g., 1.2 volts or 1.8 volts). As is also shown, the DAC 18, the headphone amplifier circuit 24, and the line out circuit 26 are coupled to a common audio output ground pin 100. As configured, the DAC 18 does not perform volume adjustment such that its output is based on the range of the DAC and not on the desired volume setting. Thus, the line out circuit 26 does not need an inverse volume function and can be individually muted while the headphone amplifier circuit 24 has an independent volume control. Further, by powering the DAC 18 and the headphone amplifier circuit 24 at a different voltage than the line out circuit 26, power consumption is reduced as well as providing individual power up/down of the headphone amplifier circuit 24 and the line out circuit 26. Accordingly, the embodiment of FIG. 4 provides a truly independent headphone amplifier circuit 24 and line out circuit 26.

Figure 5:
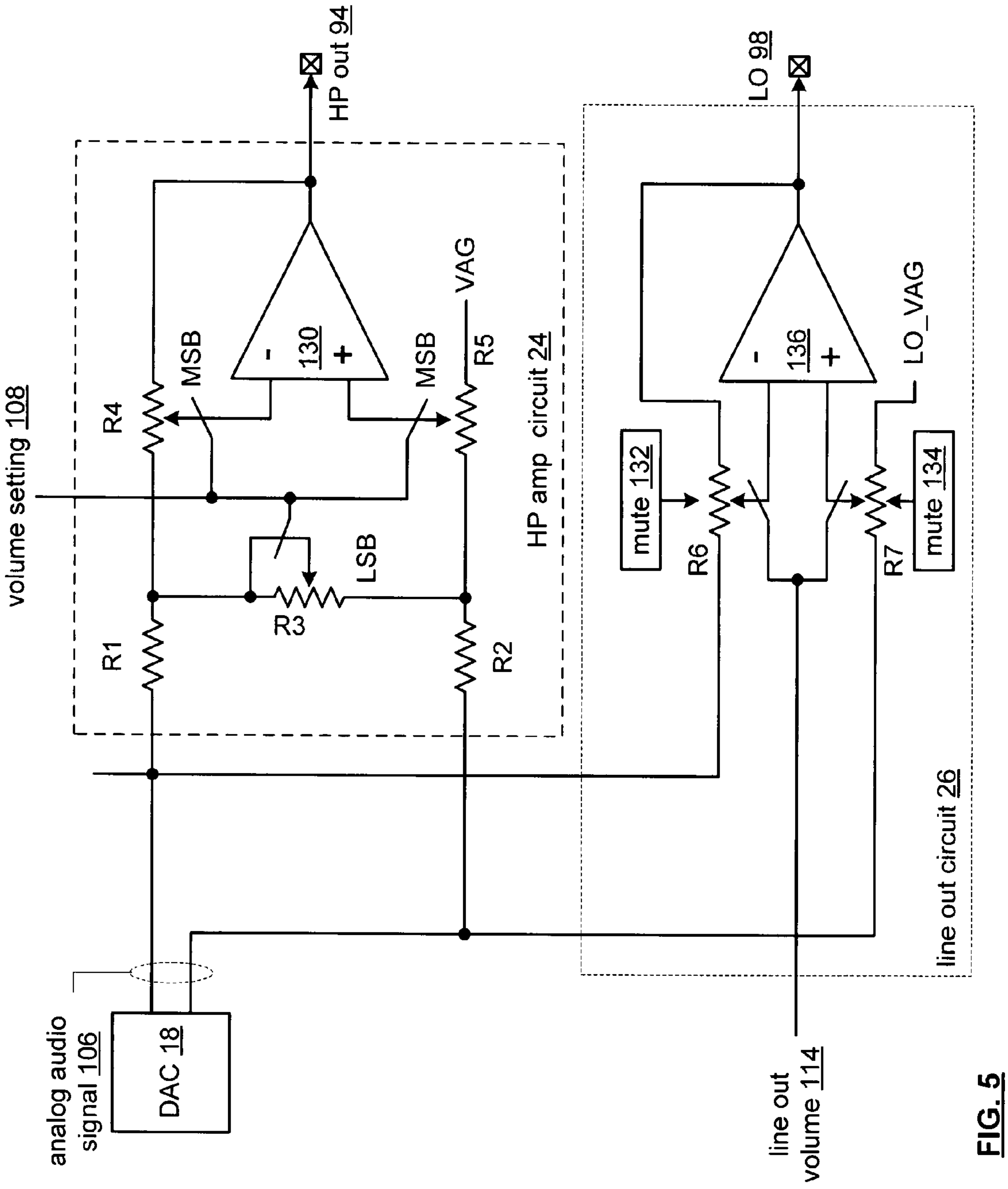
FIG. 5 is a schematic block diagram of another embodiment of a digital to analog converter module, headphone amplifier circuit, and line out circuit in accordance with the present invention.

FIG. 5 is a schematic block diagram of another an embodiment of an audio output circuit that includes a digital to analog converter (DAC) module 18, the headphone amplifier circuit 24, and the line out circuit 26. In this embodiment, the DAC module 18 converts an audio component 102 of digitized multimedia data 104 (e.g., voice data, audio data, text data, graphics data, image data, and/or video data) into a differential analog audio signal 106.

The headphone amplifier circuit 24 includes a plurality of resistors R1-R5 and an amplifier 130 to produce a single ended headphone amplifier output signal at the HP out pin 94. In this embodiment, resistors R1-R3 provide a variable attenuation of the analog audio signal 106 based on least significant bits (LSB) of the volume setting 108. Resistors R4 and R5 provide a variable amplification of the attenuated analog audio signal based on most significant bits (MSB) of the volume setting 108. As such, the headphone amplifier circuit 24 uses a combination of attenuation and amplification of the analog audio signal 106 to produce the headphone amplifier output. For a further discussion of the headphone amplifier circuit 24 and other embodiments, refer to co-pending patent application entitled "GAIN CONTROL MODULE AND APPLICATIONS THEREOF", a serial number of TBD, and a filing date of TBD.

The line out circuit 26 includes mute modules 132 and 134, resistors R6-R7, and an amplifier 136. In this embodiment, the mute modules 132 and 134, which may separate modules or a signal module, pass or mute the analog audio signal 106 based on a mute value stored in the corresponding modules 132 and 134. If the mute modules 132 and 134 pass analog audio signal 106, the resistors R6-R7 in combination with the amplifier 136 amplify the analog audio signal 106 on to the line out pin 98 in accordance with the line out volume setting 114.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A system on a chip (SOC) comprises:

a bus structure;

a processing module coupled to the bus structure;

read only memory (ROM) coupled to the bus structure;

random access memory (RAM) coupled to the bus structure;

a display interface coupled to the bus structure;

an external memory interface coupled to the bus structure;

a digital to analog conversion (DAC) module coupled to the bus structure, wherein the digital to analog converter converts an audio component of digitized multimedia data into an analog audio signal;

an analog to digital conversion module coupled to the bus structure;

a headphone amplifier circuit coupled to amplify the analog audio signal in accordance with a volume setting to provide a headphone output; and a line out circuit coupled to drive the analog audio signal to provide a line out output independent of said headphone output.

2. The SOC of claim 1 further comprises:

a line out supply voltage pin coupled to the line out circuit; and a headphone supply voltage pin coupled to the headphone amplifier circuit, wherein the line out supply voltage pin is coupled to receive a first supply voltage and the headphone supply voltage pin is coupled to receive a second supply voltage, wherein the first supply voltage is greater than the second supply voltage.

3. The SOC of claim 1 further comprises:
a line out supply voltage pin coupled to the line out circuit; and
a DAC supply voltage pin coupled to the DAC module, wherein the line out supply voltage pin is coupled to receive a first supply voltage and the DAC supply voltage pin is coupled to receive a second supply voltage, wherein the first supply voltage is greater than the second supply voltage.

4. The SOC of claim 1 further comprises:
an audio output ground pin coupled to a ground connection of the DAC module, the headphone amplifier circuit, and the line out circuit.

5. The SOC of claim 1 further comprises:
the line out circuit coupled to a first power supply voltage, wherein the first power supply voltage is greater than a power supply voltage provided to the DAC module or to the headphone amplifier circuit; and
an AC ground shift circuit coupled to the line out circuit, wherein the AC ground shift circuit adjusts an AC ground for the line out circuit based on the first power supply voltage and at least one output parameter of the DAC module.

6. The SOC of claim 1, wherein the line out circuit comprises:
an adjust input capable of adjusting an output of the line out circuit in accordance with a line out volume setting.

7. The SOC of claim 1, wherein the line out circuit comprises:
a power up/down input capable of powering up or powering down the line out circuit based on a state of a line out power up/down signal.

8. The SOC of claim 1 further comprises:
a volume pin coupled to receive the volume setting.

9. The SOC of claim 1 further comprises:
a line out supply voltage pin coupled to the line out circuit; and
a supply voltage pin coupled to the headphone amplifier circuit and the DAC module, wherein the line out supply voltage pin is coupled to receive a first supply voltage and the supply voltage pin is coupled to receive a second supply voltage, wherein the first supply voltage is greater than the second supply voltage.

10. The SOC of claim 1 further comprises:
the DAC module producing the analog audio signal as a differential analog audio signal;
the headphone amplifier circuit including a differential to single-ended topology to produce a single-ended amplified analog audio signal; and
the line out circuit including a differential to single-ended topology to produce a single-ended drive analog audio signal.

11. An audio output circuit comprises:
a digital to analog conversion (DAC) module coupled to convert an audio component of digitized multimedia data into an analog audio signal;
a line out circuit coupled to mute or amplify the analog audio signal based on a line out volume signal to provide an adjusted analog audio signal on a line out output; and
a headphone amplifier coupled to amplify the analog audio signal based on a volume setting to produce an amplified analog audio signal on a headphone output in which said amplified analog audio signal is independently adjustable from said adjusted analog audio signal.

12. The audio output circuit of claim 11 further comprises:
the line out circuit coupled to receive a first power supply voltage; and
the DAC module coupled to receive a second power supply voltage, wherein the first power supply voltage is greater than the second power supply voltage.

13. The audio output circuit of claim 11 further comprises:
the line out circuit coupled to receive a first power supply voltage; and
the headphone amplifier circuit coupled to receive a second power supply voltage, wherein the first power supply voltage is greater than the second power supply voltage.

14. The audio output circuit of claim 11 further comprises:
a common ground connection coupled to the DAC module, the line out circuit, and the headphone amplifier circuit.

15. The audio output circuit of claim 11 further comprises:
the line out circuit coupled to a first power supply voltage, wherein the first power supply voltage is greater than a power supply voltage provided to the DAC module or to the headphone amplifier circuit; and
an AC ground shift circuit coupled to the line out circuit, wherein the AC ground shift circuit adjusts an AC ground for the line out circuit based on the first power supply voltage and at least one output parameter of the DAC module.

16. The audio output circuit of claim 11, wherein the line out circuit comprises:
a power up/down input capable of powering up or powering down the line out circuit based on a state of a line out power up/down signal.

17. The audio output circuit of claim 11 further comprises:
the DAC module producing the analog audio signal as a differential analog audio signal;
the headphone amplifier circuit including a differential to single-ended topology to produce a single-ended amplified analog audio signal; and
the line out circuit including a differential to single-ended topology to produce a single-ended drive analog audio signal.

* * * * *